United States Patent [19]

Shiramizu

[11] Patent Number: 5,472,513
[45] Date of Patent: Dec. 5, 1995

[54] CLEANING METHOD FOR SEMICONDUCTOR SUBSTRATE

[75] Inventor: Yoshimi Shiramizu, Tokyo, Japan

[73] Assignee: NEC Corporation, Tokyo, Japan

[21] Appl. No.: 360,417

[22] Filed: Dec. 21, 1994

[30] Foreign Application Priority Data

Dec. 24, 1993 [JP] Japan .................... 5-327103

[51] Int. Cl.⁶ ................ C23G 1/02; B08B 3/08
[52] U.S. Cl. .............. 134/3; 134/2; 134/28; 134/41
[58] Field of Search .............. 134/2, 3, 28, 41; 252/79.2, 79.3; 156/662.1

[56] References Cited

FOREIGN PATENT DOCUMENTS

3-208899  9/1991  Japan .

Primary Examiner—Jan H. Silbaugh
Assistant Examiner—Saeed Chaudhry
Attorney, Agent, or Firm—Popham, Haik, Schnobrich & Kaufman, Ltd.

[57] ABSTRACT

In a cleaning method, two kinds of cleaning solutions, one of which is acid solution of about pH 2 or less (first cleaning solution) and other of which is acid solution of about pH 3 to 4 (second cleaning solution), are successively used to clean a semiconductor substrate. In a first cleaning step, the semiconductor substrate is cleaned with the first cleaning solution to transform metals on the surface of the semiconductor substrate to metallic complex salts, and then in a second cleaning step the semiconductor substrate is cleaned with the second cleaning solution to transfer the metallic complex salts adsorbed on the surface of the semiconductor substrate into the second cleaning solution by osmotic pressure due to the difference in pH between the first and second cleaning solutions.

6 Claims, 7 Drawing Sheets

(1) REMOVAL OF METAL FROM NATURAL OXIDE FILM

DILUTE HCl/H₂O₂/HF CLEANING LIQUID

- ● M
- ✾ MFx
- ✾ MClx
- ⊘ F
- ○ DI

FIG. 1(c) (PRIOR ART)

(2) REMOVAL OF METAL FROM SEMICONDUCTOR SUBSTRATE

DILUTE HCl/H₂O₂ CLEANING LIQUID

CLEANING LIQUID OF pH 1 HCl/H$_2$O$_2$

● M
✹ MFlx

FIG. 3(c)

CLEANING LIQUID OF pH 3 HCl/H$_2$O$_2$

CLEANING LIQUID OF pH 1 HNO3 SOLUTION

CLEANING LIQUID OF pH 3 HNO3 SOLUTION

- M
- MFx
- MClx
- F
- DI

FIG. 7(b)

CLEANING LIQUID OF pH 1 HCl/H₂O₂

FIG. 7(c)

(1) REMOVAL OF METAL FROM NATURAL OXIDE FILM

CLEANING LIQUID OF pH 3 HCl/HF

FIG. 7(d)

(2) REMOVAL OF METAL FROM SEMICONDUCTOR SUBSTRATE

CLEANING LIQUID OF pH 3 HCl/HF

CLEANING LIQUID ABOVE pH 1 (HCl:$H_2O_2$:$H_2O$=1:1:5)

- ● M
- ✷ MClx
- ○ Cl

FIG. 8(c) (PRIOR ART)

PURE-WATER RINSING/ CLEANING LIQUID (pH 7)

FIG. 8(d) (PRIOR ART)

CLEANING METHOD FOR SEMICONDUCTOR SUBSTRATE

BACKGROUND OF THE INVENTION

1. Field of the Invention

This invention relates to a cleaning technique for a semiconductor substrate, and particularly to a cleaning method for a semiconductor substrate with acid cleaning solution.

2. Prior Art

A high integration technique for semiconductor devices have been increasingly developed, and upon following this increasing development of the high integration, it has been required that semiconductor substrates should be cleaned with high purification and also impurities contained in fine groove portions on the semiconductor substrates should be selectively removed.

A cleaning method using cleaning solution which contains components of $HCl/H_2O_2/H_2O=1:1:5$ has been known as a conventional method of cleaning semiconductor substrates. Further, Japanese Laid-open Patent Application No. 3-208899 discloses a wet cleaning method using dilute acid which is obtained by properly mixing HCl of 0.1% or more, $H_2O_2$ of about 0.05 to 10 wt % and HF of 0.05 to 10 wt %, and a dry cleaning method using light and $Cl_2$ gas. The wet cleaning method is classified into two types, a strong acid cleaning method and a dilute acid cleaning method.

Figure 1A:
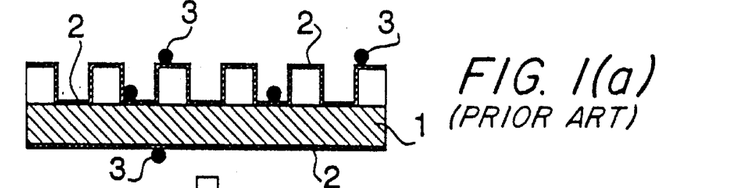
Figures 1B, 1C:
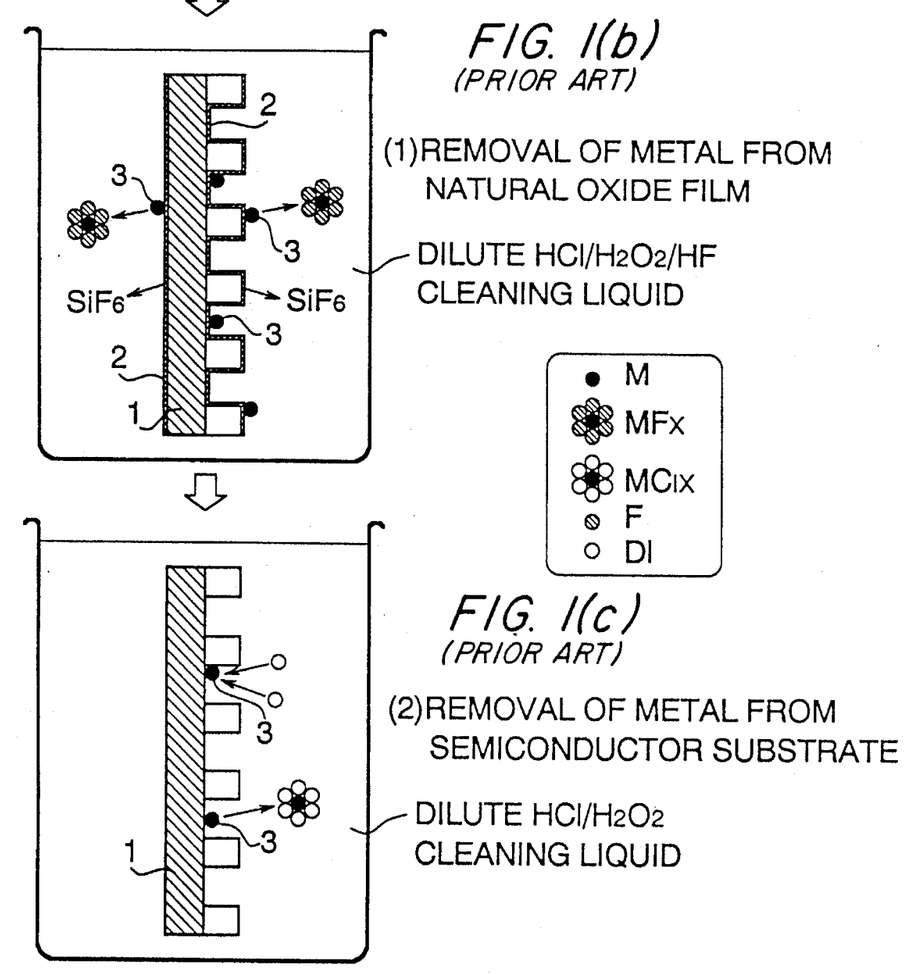
Figure 1D:
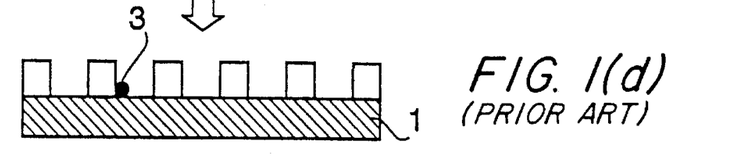

In the strong acid cleaning method (below pH 1), metallic impurities on a semiconductor substrate is disolved and removed with $HCl/H_2O_2$ water-solution having strong oxidizing power. In the dilute acid cleaning method (about pH 3), metallic impurities 3 are removed with dilute hydrofluoric acid simultaneously with removal of naturally-oxidized (natural oxide) films 2 which are naturally formed on the surface of the substrate, and metallic impurities on the semiconductor substrate 1 are oxidized and solved with dilute $HCl/H_2O_2$ to be removed. That is, various metallic impurities are effectively removed through a competitive reaction as shown in FIG. 1.

Figure 2:
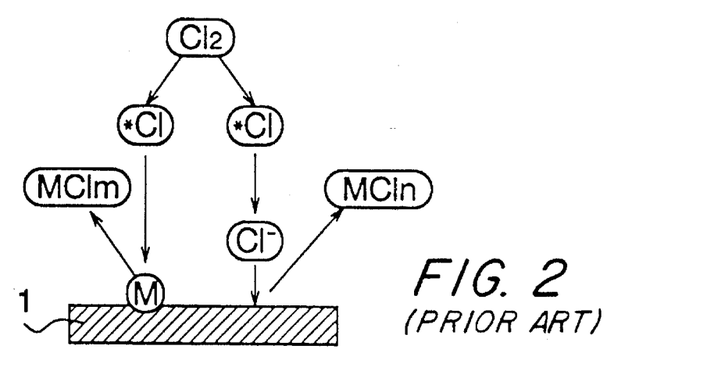
FIG. 2 is a schematic diagram showing a cleaning mechanism in a conventional dry cleaning method.

On the other hand, in the dry cleaning method, metallic impurities 3 on the semiconductor substrate 1 are coupled with chlorine radicals which are produced from $Cl_2$ gas at all times, thereby removing the metallic impurities from the semiconductor substrate 1. The following reaction occurs on the basis of an action between $Cl_2$ and light:

According to this method, metal trapped in fine groove portions on the semiconductor substrate can be removed because gas is used.

However, the conventional cleaning method as described above still has the following problems. That is, in the strong acid cleaning method of the wet cleaning method, the metallic impurities on the surface of the semiconductor substrate can be easily oxidized and solved. However, the cleaning solution hardly penetrates into fine groove portions because it has high viscosity, and even if the cleaning solution penetrates into the fine groove portions, the metallic impurities are hardly discharged from the surface of the semiconductor substrate into the cleaning solution. Therefore, the metallic impurities may re-precipitate on the surface of the semiconductor substrate in a subsequent rinse process with pure water.

In the dilute acid cleaning method using dilute $HCl/H_2O_2/$FH cleaning solution, the cleaning solution has low acidity, and thus the metallic impurities which have once been eluted from the surface of the semiconductor into the cleaning solution may adhere to the surface of the semiconductor substrate again. In addition, the cleaning solution has insufficient metal-ionizing power because it has weak oxidizing power, and thus it has low efficiency to solve the metal. Therefore, in consideration of the above two disadvantages, this method is ineffective to remove the metal.

In the dry cleaning method using light and $Cl_2$, the metallic impurities in the fine groove portions are more easily removed than in the wet cleaning method, however, adherence of particles to the surface of the semiconductor substrate is unavoidable because the dry cleaning process is used.

Particularly, the recent progress of designing semiconductor devices in a fine structure has increasingly intensified the effect of metallic impurities on characteristics of the semiconductor devices and the manufacturing yield thereof. When the metallic impurities adhere to the surface of the semiconductor, an insulation break-down voltage of a silicon oxide film is remarkably lowered and increase of p-n junction leak current is induced, so that the characteristics of the semiconductor devices are deteriorated and the yield is lowered.

SUMMARY OF THE INVENTION

An object of the present invention is to provide a cleaning method in which metallic impurities remaining in fine portions on the surface of a semiconductor substrate can be efficiently removed without inducing reprecipitation of the metallic impurities on the semiconductor substrate.

In order to attain the above object, the cleaning method according to the present invention comprises the steps of: contacting metallic impurities on a semiconductor substrate with first cleaning solution of about pH 2 or less (i.e., whose acidity is identical to or stronger than that of pH 2) to produce metallic complex salts to solve and remove the metallic impurities as the metallic complex salts from the semiconductor substrate, and contacting the residual solution of the first cleaning solution adsorbed onto the surface of the semiconductor substrate with second cleaning solution of about pH 3 to pH 4 to transfer the metallic complex salts remaining in the residual solution of the first cleaning solution into the second cleaning solution by osmotic pressure which is produced due to the difference in pH between the first cleaning solution and the second cleaning solution, thereby removing the metallic complex salts from the surface of the semiconductor substrate.

In the cleaning method as described above, as the first cleaning solution is preferably used cleaning solution which mainly contains at least one material selected from the group consisting of hydrochloric acid (HCl), hydrogen peroxide ($H_2O_2$), sulfuric acid ($H_2SO_4$) and nitric acid ($HNO_3$). Specifically, as the cleaning solution may be used water solution containing mainly $HCl/H_2O_2$, water solution containing mainly $H_2SO_4/H_2O_2$, water solution containing mainly $HNO_3$ or the like.

As the second cleaning solution is preferably used cleaning solution which mainly contains at least one material selected from the group consisting of hydrochloric acid (HCl), hydrogen peroxide ($H_2O_2$), hydrofluoric acid (HF) and nitric acid ($HNO_3$). Specifically, as the cleaning solution may be used water solution containing mainly $HCl/H_2O_2$, water solution containing mainly $HF/H_2O_2$, water solution containing mainly $HNO_3$ or the like.

In the cleaning method according to the present invention, the cleaning treatment of the semiconductor substrate is performed in the two steps using two types of cleaning solution having different pH. Therefore, the metallic complex salts which are formed in the first cleaning step with the first cleaning solution is easily diffused into the second cleaning solution from the surface of the semiconductor substrate by the osmotic pressure in the second cleaning step, and thus the removing efficiency of the metal impurities on the semiconductor substrate is improved.

Further, unlike the conventional strong acid cleaning method, the wet cleaning method and the dry cleaning method, the re-adherence of the metallic impurities onto the surface of the semiconductor substrate can be prevented, and particularly the removing efficiency of the metallic impurities remaining in fine-structure portions can be improved.

In addition, the cleaning method of the present invention adopts a wet cleaning process, and thus the adherence of particles can be suppressed. Further, consumption of chemical solution can be reduced, and thus high-quality semiconductor devices can be manufactured at low cost and in high yield.

DETAILED DESCRIPTION OF THE INVENTION

In the conventional cleaning method, the metallic impurities on the semiconductor substrate, which are targets to be removed from the semiconductor substrate, are solved in the cleaning solution and removed in the form of metallic complex salts by immersing the semiconductor substrate in the cleaning solution or the like. However, the metallic impurities are adsorbed onto the semiconductor substrate together with the cleaning solution at an uneven portion or fine groove portion on the semiconductor substrate even if the metallic complex salts are formed, so that the metallic impurities are hardly diffused or discharged from the semiconductor substrate. Particularly, in many cases, cleaning solution having low pH has high viscosity, and this phenomenon more frequently occurs for the low-pH cleaning solution.

Accordingly, in the conventional cleaning method, it is difficult to remove not only the cleaning solution at the uneven and fine groove portions, but also the metallic complex salts which are solved in the cleaning solution because the metallic complex salts still remain in the neighborhood of the semiconductor substrate irrespective of a long-term cleaning treatment. Therefore, the metals precipitate on the semiconductor substrate when the cleaning solution is vaporized to dry the semiconductor substrate.

On the other hand, in the cleaning method of the present invention, the semiconductor substrate is cleaned with the first cleaning solution having a low pH in the first cleaning step, and then cleaned with the second cleaning solution having a larger pH (lower acidity) than the first cleaning solution in the second cleaning step. In this cleaning method, the first cleaning solution and the metallic complex slats still remain at the uneven portion and the fine groove portion of the semiconductor substrate even after the cleaning treatment with the first cleaning solution (first cleaning step) is completed, however, the osmotic pressure which directs from the first cleaning solution to the second cleaning solution occurs due to the difference in pH between the first cleaning solution and the second cleaning solution because the second cleaning solution has the pH larger than the first cleaning solution, whereby the solved material (solute) in the first cleaning solution is transferred to the second cleaning solution. At this time, the metallic complex salts are also transferred to the second cleaning solution together with the second cleaning solution. In other words, the metallic complex salts can be removed from the surface of the semiconductor substrate. Accordingly, it is prevented that the metallic complex salts re-precipitate in the form of metal on the surface of the semiconductor substrate when the cleaning solution is vaporized to dry the semiconductor substrate.

Further, when acid solution having pH below about pH 2 (i.e., higher acidity) is used as the first cleaning solution, the metallic impurities on the semiconductor substrate are easily solved in the solution because of its strong acidity, and thus metallic complex salts are formed.

When cleaning solution having pH of about 3 to 4 (i.e., lower acidity) is used as the second cleaning solution, metallic complex salts remaining in the fine groove portion and metals which still remain on the semiconductor substrate without being solved in the first cleaning solution are discharged into the second cleaning solution by the osmotic pressure which occurs due to the difference in acid concentration. In addition, the second cleaning solution serves to not only assist the discharge of the metallic impurities from the fine groove portion on the semiconductor substrate, but also suppress the reprecipitation of the metallic complex salts on the surface of the semiconductor substrate.

Further, the cleaning solution whose pH is equal to about 3 to 4 has low viscosity, and thus the metal which has still remained on the surface of the semiconductor substrate because of insufficient penetration of the first cleaning solution into the fine groove portion can be easily solved and removed by the second cleaning solution. If the Ph-value is more than about 4 (i.e., has lower acidity than that of pH 4), metal such as Al or the like is liable to precipitate. On the other hand, if the pH is less than about 3 (i.e., higher acidity than that of pH 3), metal such as Cr or the like is liable to precipitate. Particularly when the pH is increased up to the neutral value (pH 7), the metallic complex salts become unstable, and only ligands in the metallic complex salts are discharged. Therefore, the metal reprecipitation is liable to occur, particularly at the fine groove portion. In consideration of the foregoing, the second cleaning solution is preferably set to about 3 to 4 in pH.

BRIEF DESCRIPTION OF THE DRAWINGS

FIGS. 1(a–d) are cross-sectional views showing a cleaning process of a conventional cleaning method;

FIGS. 3(a–d) are cross-sectional views showing a cleaning process of a cleaning method according to Example 1 of the present invention;

FIGS. 6(a–d) are cross-sectional views showing a cleaning process of Example 2 of the present invention;

FIGS. 7(a–e) are cross-sectional views showing a cleaning process of Example 3 of the present invention; and FIGS. 8(a–d) are cross-sectional views showing a cleaning process of the conventional cleaning method.

DESCRIPTION OF PREFERRED EMBODIMENTS

In the following comparison experiment between the embodiments of this invention and the comparative example, the same semiconductor substrates were prepared as a cleaning target for various kinds of cleaning methods, and the cleaning performance for the semiconductor substrates were estimated.

Figure 4:
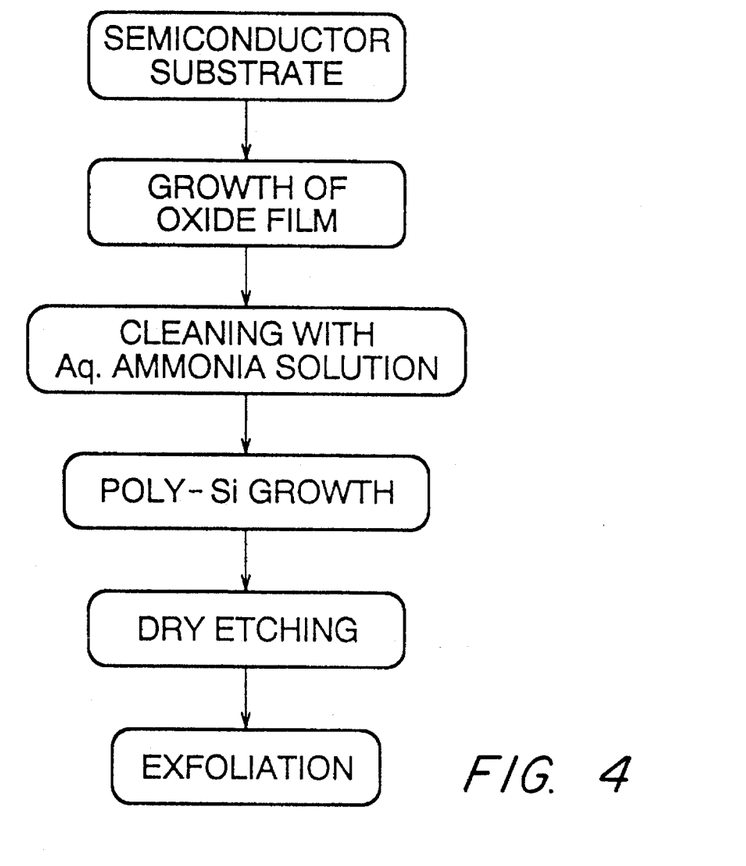
FIG. 4 is a flowchart for a cleaning pre-treatment process for a semiconductor substrate.

High-temperature film growth, a dry etching treatment, etc. were performed as a treatment of promoting adherence of metal to the semiconductor substrate. FIG. 4 is a flowchart for showing this treatment. Further, the semiconductor substrate to which metal was promoted to adhere in the above treatment was immersed in $NH_4OH/H_2O_2/H_2O$ cleaning solution, and then rinsed with pure water after the cleaning treatment.

EXAMPLE 1

A semiconductor substrate, serving as the cleaning target, was cleaned in two cleaning steps with $HCl/H_2O_2$ cleaning solution of about pH 1 (first cleaning solution) and $HCl/H_2O_2$ cleaning solution of about pH 3 (second cleaning solution).

The cleaning mechanism for the embodiment is shown in (a) to (d) of FIG. 3. As shown in (a) of FIG. 3, the metallic impurities, which are targets to be removed, adhere to the semiconductor substrate 1.

Figure 3A:
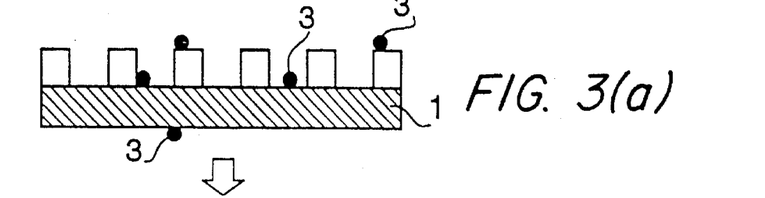
Figure 3B:
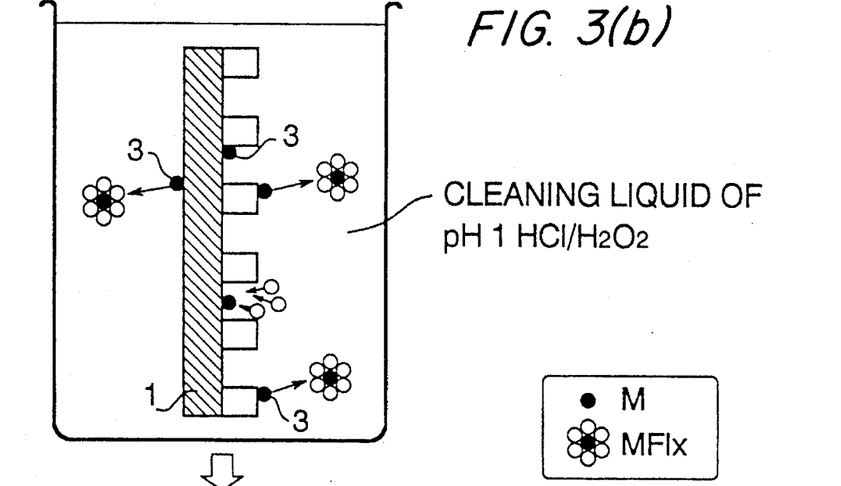

At the first cleaning step, the semiconductor substrate 1 is immersed into the first cleaning solution. In this step, the metals on the semiconductor substrate 1 are easily oxidized with strong acid, and transformed to metallic complex salts of $MCl_x$ (M represents metal) as shown in (b) of FIG. 3. The number of chlorine atoms which coordinated to each metal atom is varied in accordance with the kind of metal, and it is usually about 4 to 6.

The metallic complex salts are easily formed as described above. However, even when the metallic complex salts are formed at an uneven portion or fine groove portion of the semiconductor substrate, these metallic complex salts are hardly diffused into the first cleaning solution because the first cleaning solution has high viscosity.

Therefore, it is difficult to remove the metallic complex salts at these portions on the semiconductor substrate 1, and the metallic complex salts still remain in the neighborhood of the semiconductor substrate 1 even when the cleaning treatment is carried out for a long time. Accordingly, the metal precipitates on the semiconductor substrate 1 when the cleaning solution is dried.

Figure 3C:
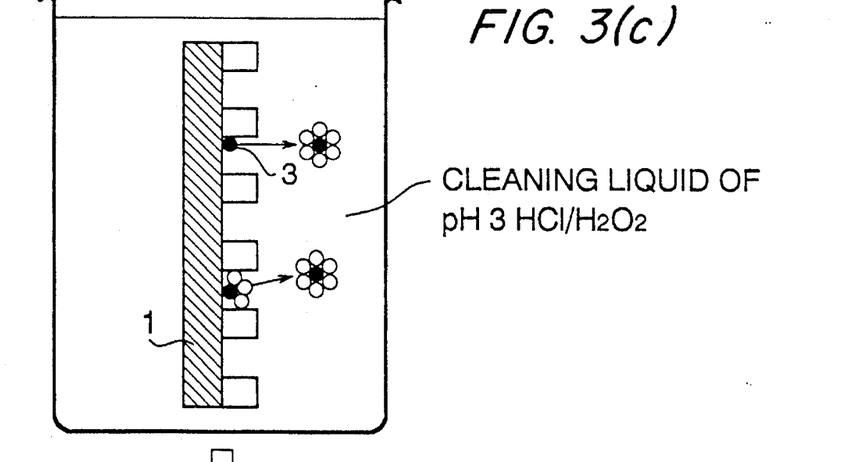

In consideration of the foregoing problem, in the second cleaning step, the semiconductor substrate 1 which has been subjected to the first cleaning step is immersed in $HCl/H_2O_2$ cleaning solution of about pH 3.

The first cleaning solution and the metallic complex salts remain at the uneven portion or fine groove portion of the semiconductor substrate 1 as described above. However, the second cleaning solution contains HCl and $H_2O_2$ whose concentration is lower than the first cleaning solution, and thus the osmotic pressure directing from the first cleaning solution to the second cleaning solution occurs due to the difference in concentration therebetween. Therefore, as shown in (c) of FIG. 3, the first cleaning solution remaining in the neighborhood of the semiconductor substrate 1 is diffused into the second cleaning solution surrounding the first cleaning solution.

Figure 3D:
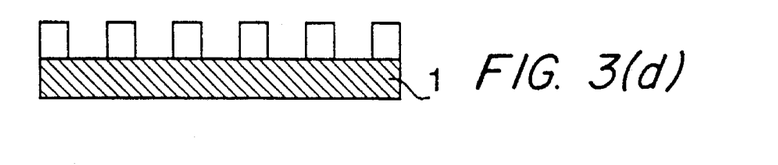

The diffusion of the first cleaning solution into the second cleaning solution as described above simultaneously induces the diffusion of the metallic complex salts into the second cleaning solution. As shown in (d) of FIG. 3, most of the metallic complex salts in the neighborhood of the semiconductor substrate 1 are removed, so that the metal hardly precipitates on the semiconductor substrate even when the cleaning solution is dried.

The semiconductor substrate 1 is cleaned in the manner as described above to remove the impurity particles such as metal particles, etc. from the semiconductor substrate substantially perfectly.

The first cleaning solution has high viscosity as described above, and thus at some portions the metal may not be perfectly solved in the first cleaning solution because the first cleaning solution does not sufficiently penetrate into these portions. However, the second cleaning solution can penetrate into these portions because it has low viscosity, and thus the metal can be perfectly solved and removed.

Particularly, the dilute solution of about pH 3 which was used as the second cleaning solution has low viscosity, and it was liable to penetrate into the fine groove portion. Accordingly, the metal which has not sufficiently solved due to insufficient penetration of the first cleaning solution can be perfectly solved and removed with the second cleaning solution.

Here, if pH≧4, metal such as Al is liable to precipitate, and if pH<3, metal such as Cr is liable to precipitate. Particularly if the pH is increased to the neutral value (pH 7), the produced metallic complex salts become unstable, so that only ligands in the metallic complex salts may be discharged. Therefore, reprecipitation of the metal is liable to occur at the fine groove portion.

For the reason as described above, the second cleaning solution is required to have such acidity (about pH 3 to pH 4) that various kinds of metallic complex salts exist stably in the second cleaning solution. As described above, the removing efficiency of the metal on the semiconductor substrate 1 can be improved by carrying out the cleaning treatment of the semiconductor substrate 1 in the manner as described above.

Further, the same effect was obtained by replacing $HCl/H_2O_2$ with $H_2SO_4/H_2O_2$ which was estimated to have a slightly larger amount of impurities. The temperature of the cleaning solution was set to about 65° C. in both of the cleaning method using $HCl/H_2O_2$ and the cleaning method using $H_2SO_4/H_2O_2$.

COMPARATIVE EXAMPLE

The cleaning target (semiconductor substrate 1) was cleaned with conventional cleaning solution ($HCl/H_2O_2/H_2O$= 1:1:5), and then subjected to a rinse cleaning treatment with pure water.

Figures 8A, 8B:
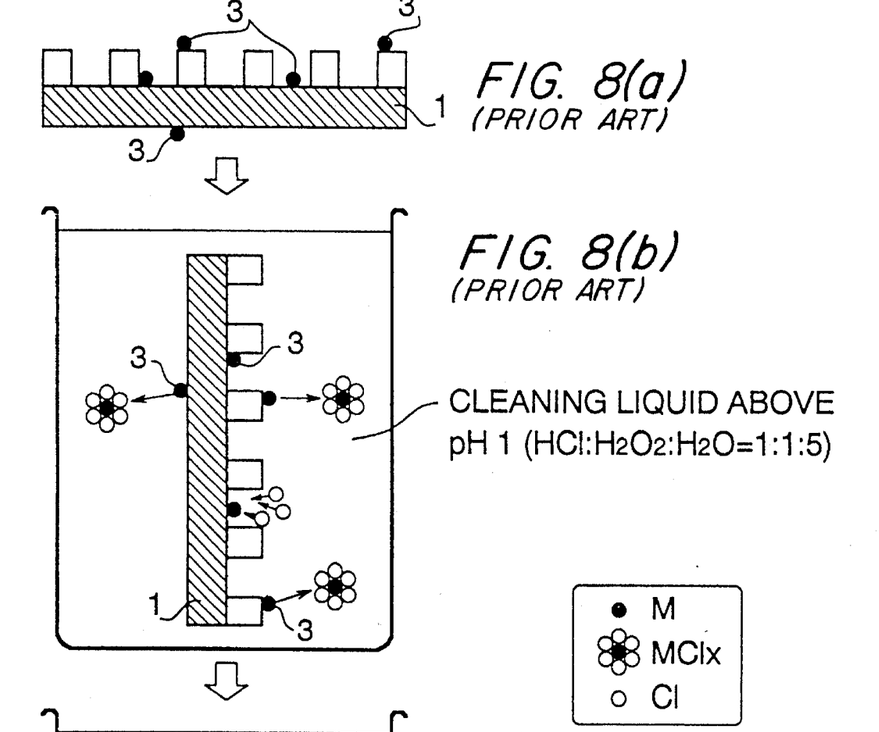

FIG. 8 shows a cleaning mechanism of the cleaning treatment with the conventional cleaning solution. The cleaning solution has pH of about 1 or more, and thus it has excellent oxidizing power. Therefore, as shown in (a) and (b) of FIG. 8, the metallic impurity particles 3 on the semiconductor substrate 1 are easily transformed to metallic complex salts.

Figure 8C:
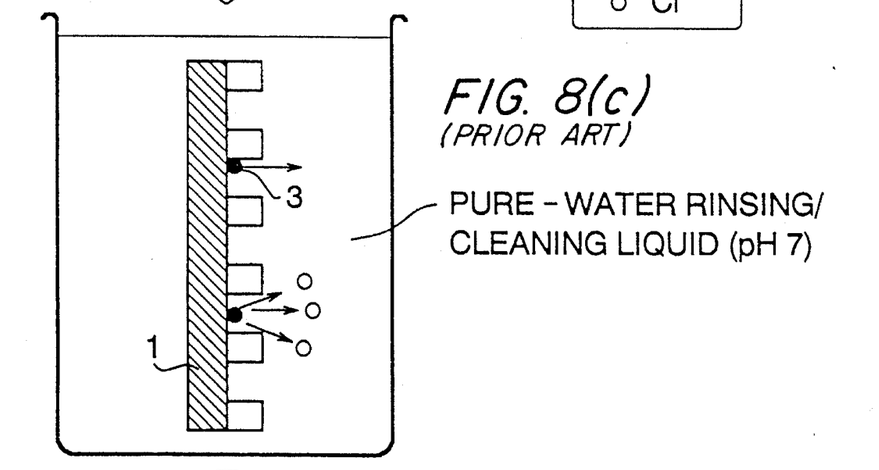
Figure 8D:
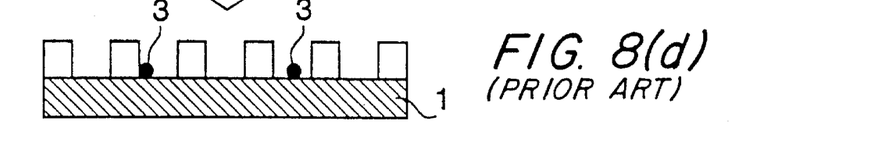

However, this cleaning solution hardly penetrates into the fine groove portion because it has high viscosity. Therefore, as shown in (c) and (d) of FIG. 8, even when the cleaning solution succeeds to penetrate into the fine groove portion and the metallic complex salts are formed, the metallic complex salts thus formed are hardly discharged into the cleaning solution.

Subsequently, upon the pure-water rinse cleaning treatment (about pH 7), most of the metallic complex salts exist unstably in the pure water even when the metallic complex salts are formed, so that only the ligands in the metallic complex salts are discharged. Particularly at the fine groove portion, the reprecipitation of metal is liable to occur in accordance with the following chemical equation:

$$MCL_x \rightarrow XCl + M$$

Figure 5:
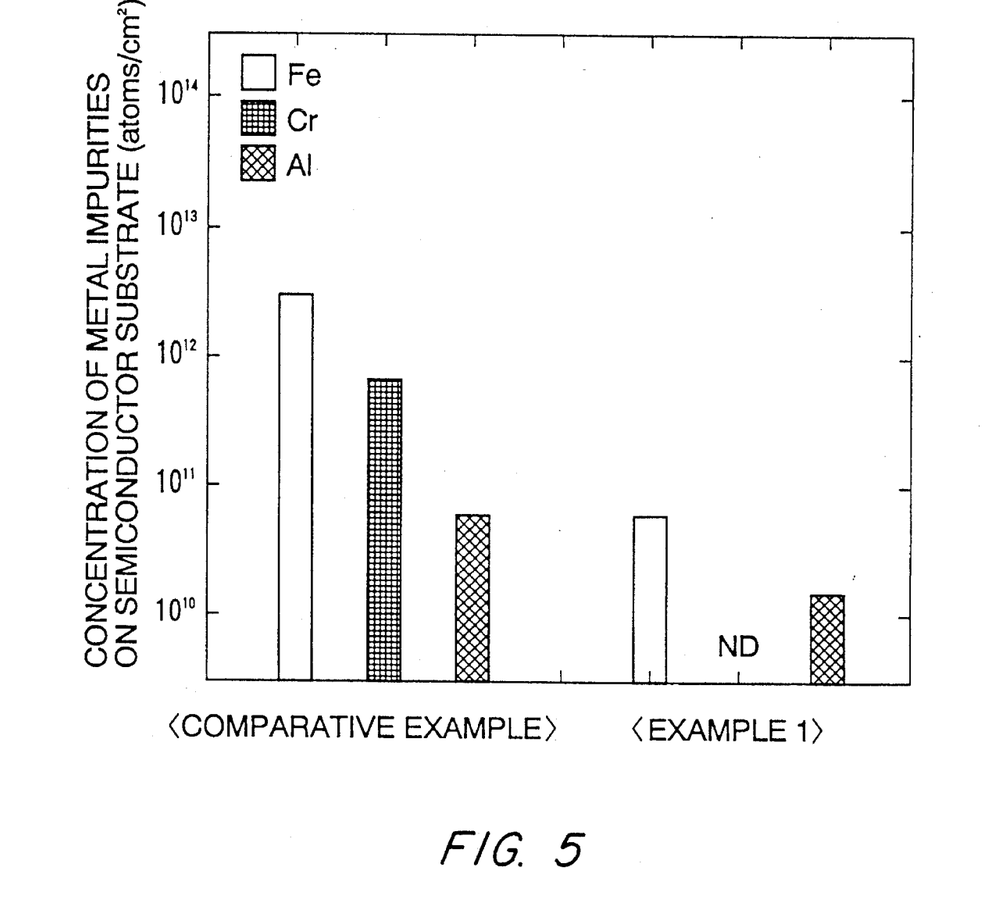
FIG. 5 is a graph showing the surface density of metallic impurities of cleaned semiconductor substrates of Example 1 and a comparative example.

A quantitative analysis of various kinds of metal elements remaining on the semiconductor substrate 1 after the cleaning treatment was performed for the semiconductor substrates 1 which had been subjected to the cleaning treatment according to the methods of the embodiment 1 and the comparative example respectively, and the result is shown in FIG. 5.

This measurement was performed by solving the various kinds of metals on the semiconductor substrate 1 with hydrofluoric acid vapor phase composition, and then making the quantitative analysis thereof with the atomic absorption spectrometry.

As is apparent from the graph shown in FIG. 5, substantially no metal existed on the surface of the semiconductor substrate 1 which had been cleaned by the cleaning method of the first embodiment. On the other hand, a large amount of metal existed on the surface of the semiconductor substrate which had been cleaned by the cleaning method of the conventional method (comparative example). Accordingly, the effectiveness of the cleaning solution of the present invention was proved by this measurement result.

EXAMPLE 2

The semiconductor substrate serving as the cleaning target was cleaned in two cleaning steps with $HNO_3$ water-solution (first cleaning solution) whose pH was adjusted to about pH 1 and $HNO_3$ water-solution (second cleaning solution) whose pH was adjusted to about pH 3. During the cleaning process, these cleaning solutions were kept at 70° C. The cleaning mechanism of this embodiment is shown in FIG. 6.

Figure 6A:
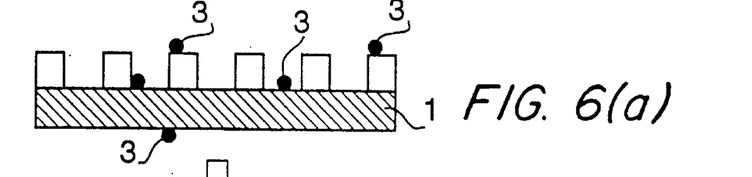
Figure 6B:
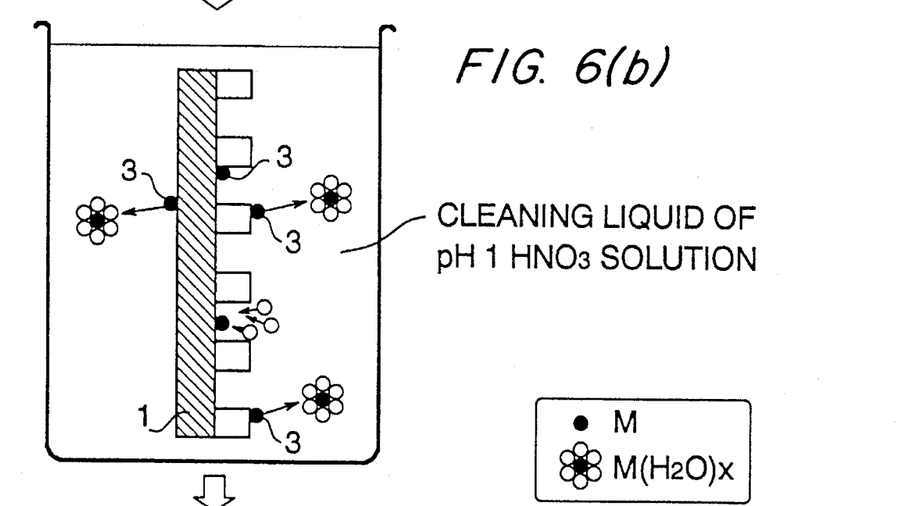
Figure 6C:
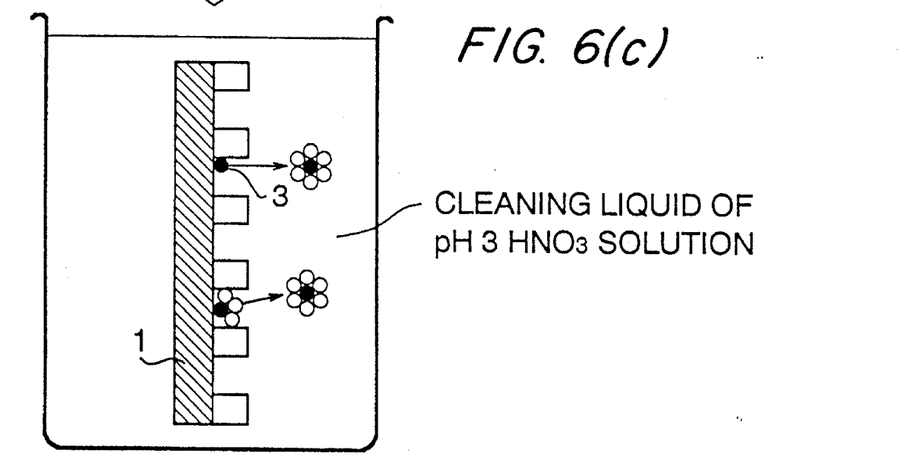
Figure 6D:
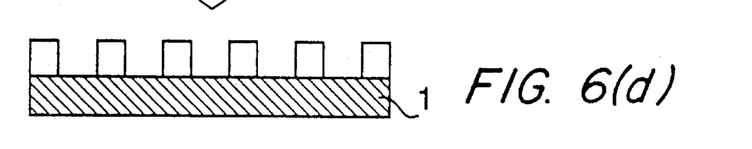
Figure 7A:
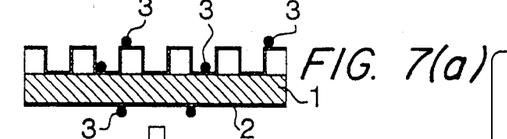
Figure 7B:
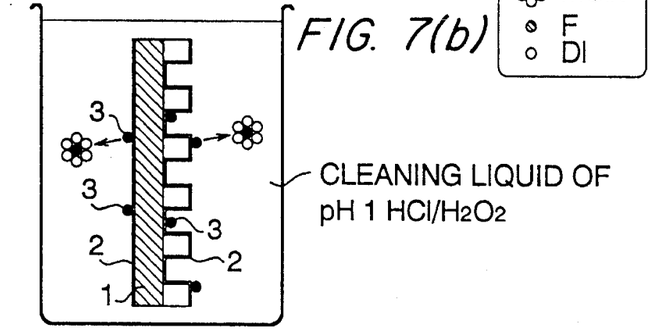
Figure 7C:
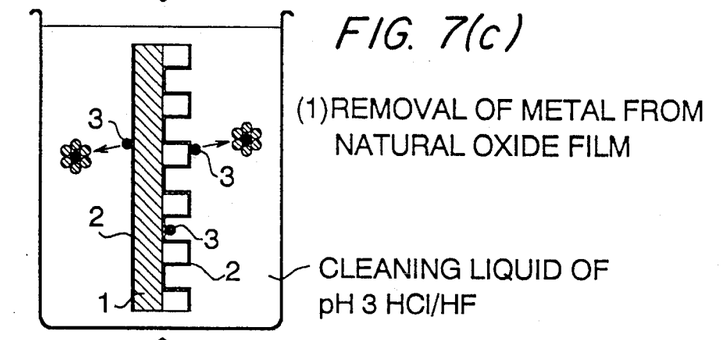
Figure 7D:
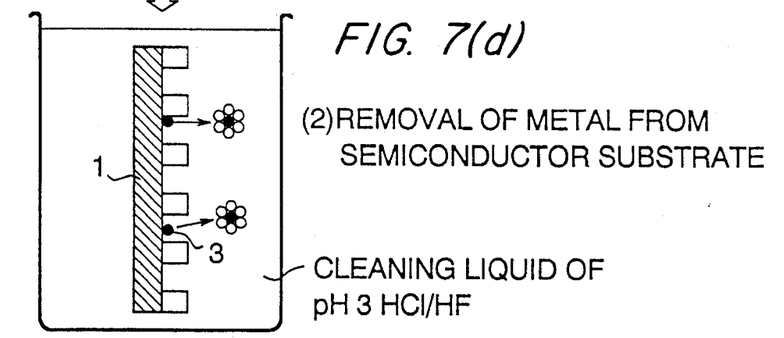
Figure 7E:
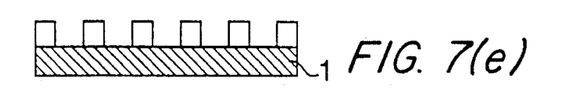

As shown in (a) and (b) of FIG. 6, in the first cleaning step, the metallic impurities 3 on the semiconductor substrate 1 were easily oxidized by the first cleaning solution having excellent oxidizing power, and the metallic complex salts thereof were formed in accordance with the reaction represented by the following chemical equations:

$$M + XH_2O + Ye^- \rightarrow [M(H_2O)_x]Y^+$$

$$M + XHNO_3 + Ye^- \rightarrow [M(NO_3)_x]Y^+ + XH^+$$

(where M: metal, and X, Y: constant)

Thereafter, as shown in (c) and (d) of FIG. 6, in the second cleaning step, the semiconductor substrate was cleaned with the second cleaning solution, whereby the metal or metallic complex salts remaining at the uneven portion and the fine groove portion on the semiconductor substrate 1 were easily solved and removed.

By the cleaning method as described above, the semiconductor substrate thus cleaned had an extremely small amount of metal residue like the first embodiment.

EXAMPLE 3

In this embodiment 3, the semiconductor substrate serving as the cleaning target was cleaned in two cleaning steps with $HCl/H_2O_2$ water-solution (first cleaning solution) whose pH was adjusted to about pH 1 and HF/HCl water-solution (second cleaning solution) whose pH was adjusted to about pH 3. During the cleaning process, these cleaning solutions were kept at 65°.

FIG. 7 shows a cleaning mechanism when the cleaning solution of the embodiment 3 was used.

As shown in (a) and (b) of FIG. 7, in the first cleaning step, the metallic impurity particles 3 on the semiconductor substrate 1 were easily oxidized by the first cleaning solution having excellent oxidizing power, and the metallic complex salts were formed.

Thereafter, as shown in (c) and (d) of FIG. 7, the semiconductor substrate was cleaned with HF/HCl of about pH 3, whereby the metal remaining at the uneven portion and the fine groove portion on the semiconductor substrate 1 and the metal trapped in a naturally-oxidized film were easily solved and discharged.

In the cleaning process as described above, the residual metallic impurity particles 3 remaining on the semiconductor substrate 1 and in the naturally-oxidized film were removed, and the cleaned semiconductor substrate 1 was obtained like the first embodiment (see (e) of FIG. 7).

Particularly even when the different kinds of cleaning solutions are used as the first and second cleaning solutions like this embodiment, a desired cleaning effect can be obtained if the pH difference between these cleaning solutions is large.

What is claimed is:

1. A cleaning method for cleaning a semiconductor substrate, comprising the steps of:

contacting metallic impurities on a semiconductor substrate with first cleaning solution of about pH 2 or less to produce metallic complex salts to solve and remove the metallic impurities as the metallic complex salts from the semiconductor substrate; and contacting the residual solution of said first cleaning solution adsorbed onto the surface of the semiconductor substrate with second cleaning solution of about pH 3 to pH 4 to transfer the metallic complex salts remaining in the residual solution of said first cleaning solution into said second cleaning solution using osmotic pressure which is produced due to the difference in pH between said first cleaning solution and said second cleaning solution, thereby removing the metallic complex salts from the surface of the semiconductor substrate.

2. The cleaning method as claimed in claim 1, wherein said first cleaning solution comprises cleaning solution which mainly contains at least one material selected from the group consisting of hydrochloric acid (HCl), hydrogen peroxide ($H_2O_2$), sulfuric acid ($H_2SO_4$) and nitric acid ($HNO_3$), and said second cleaning solution comprises cleaning solution which mainly contains at least one material selected from the group consisting of hydrochloric acid (HCl), hydrogen peroxide ($H_2O_2$), hydrofluoric acid (HF) and nitric acid ($HNO_3$).

3. The cleaning method as claimed in claim 1, wherein said first cleaning solution comprises $HCl/H_2O_2$ water-solution of about pH 1, and said second cleaning solution comprises $HCl/H_2O_2$ water-solution of about pH 3.

4. The cleaning method as claimed in claim 1, wherein said first cleaning solution comprises $HCl/H_2O_2$ water-solution of about pH 1, and said second cleaning solution comprises HF/HCl water-solution of about pH 3.

5. The cleaning method as claimed in claim 1, wherein said first cleaning solution comprises $H_2SO_4/H_2O_2$ water-solution of about pH 1, and said second cleaning solution comprises $HCl/H_2O_2$ water-solution of about pH 3.

6. The cleaning method as claimed in claim 1, wherein said first cleaning solution comprises $HNO_3$ water-solution of about pH 1, and said second cleaning solution comprises $HNO_3$ water-solution of about pH 3.

\* \* \* \* \*